United States Patent [19]

Brant et al.

[11] 3,780,238

[45] Dec. 18, 1973

[54] MULTI SECTIONAL ROTARY WAFER SWITCH ASSEMBLY WITH IMPROVED SUPPORT AND TERMINAL CONNECTOR FOR THIN CIRCUIT MODULE

[75] Inventors: Roy G. Brant, Huntington Beach; Stephen K. Shepard, Pasadena, both of Calif.

[73] Assignee: Beckman Instruments, Inc., Fullerton, Calif.

[22] Filed: Dec. 27, 1971

[21] Appl. No.: 212,061

[52] U.S. Cl. ......... 200/11 DA, 200/14, 317/101 CC, 317/101 D

[51] Int. Cl. ......................... H01h 21/78, H05k 1/07

[58] Field of Search ........................ 317/101 D, 101; 200/11 DA, 11 D, 14, 166 PC

[56] References Cited

UNITED STATES PATENTS

| | | | |
|---|---|---|---|
| 2,870,400 | 1/1959 | Hickok, Jr. | 317/101 B UX |
| 3,488,842 | 1/1970 | Rochette et al. | 317/101 CC X |
| 3,259,804 | 7/1966 | Parstorfer | 317/101 C X |
| 3,447,040 | 5/1969 | Denton, Jr. | 317/101 CP UX |
| 3,340,439 | 9/1967 | Henschen et al. | 317/101 D |

*Primary Examiner*—J. R. Scott
*Attorney*—Ferd L. Mehlhoff et al.

[57] ABSTRACT

A carrier and terminal connector for a nonconductive circuit module in the form of a thin wafer having oppositely disposed flat surfaces and an electrical cicuit network deposited on at least one surface thereof including terminal pads positioned along at least one edge thereof. The carrier, terminal connector and non-conductive circuit module are used in a multi-sectional rotary wafer switch assembly. A conductive rotor engages printed circuit terminal paths disposed on the face of the circuit module.

12 Claims, 9 Drawing Figures

PATENTED DEC 18 1973

3,780,238

MULTI SECTIONAL ROTARY WAFER SWITCH ASSEMBLY WITH IMPROVED SUPPORT AND TERMINAL CONNECTOR FOR THIN CIRCUIT MODULE

BACKGROUND OF THE INVENTION

The invention relates to an electrical circuit module or wafer having an electrical network of passive and active components attached to a surface thereof and more particularly to a support and terminal carrier adapted to support such an electrical circuit wafer and to provide means for making external electrical connections to the circuitry on the wafer. An example of the type of electrical circuit wafer to which the assembly of the present invention is particularly well adapted is disclosed in U.S. Pat. No. 3,518,389, issued June 30, 1970, entitled "Rotor Assembly for Integral Electrical Switch" and U.S. Pat. No. 3,594,527, issued July 20, 1971, entitled "Rotor Assembly for Electrical Switch." Both of the above patents are assigned to the same assignee as the present invention.

The above-mentioned patents relate to an integral rotary switch and circuit network in the form of an electrically non-conductive module, or thin wafer, having an electrical network deposited or otherwise attached thereon and including a plurality of switch pads arranged on the surface of the wafer in a predetermined path so as to be engaged by a conductive wiper carried by an operating member. The electrical circuit network includes a number of electrical connectors terminating at a plurality of terminal pads deposited along at least one edge of the wafer. It is the practice to attach terminal leads to these terminal pads, by welding or pressure contact, in order to make external electrical connections to the circuit network on the wafer.

In the above-mentioned patents, the device is a rotary switch and the wafer is provided with an aperture through which a rotor is mounted. The rotor supports one or more electrically conductive wipers which rotate in an arcuate path over the surface of the base to make successive electrical contact with switch pads that are, in turn, connected to various points in the electrical circuit network on the wafer.

It has been found desirable to provide a protective carrier which supports the above described electrical circuit module or wafer and which facilitates making electrical connections between such modules and external circuitry or between adjacent modules. The carrier also protects the wafer during handling, storage and during their assembly with other components.

SUMMARY OF THE INVENTION

The present invention relates to a nonconductive frame having a back, side walls and an end wall enclosing three sides of an interior space having the shape of the electrical circuit wafer. The wafer is supported within the space and retained therein by terminal members in the end wall of the frame and by resilient arms extending from the side walls of the frame which exert a force on the surface of a circuit wafer toward the back of the frame and prevent movement of the wafer except in a direction toward the open end of the frame.

It is an object of the invention to provide a support means for a circuit wafer or module which protects the wafer against external forces and also provides quick and easy electrical connections with the electrical circuitry supported on the wafer.

It is another object of the invention to provide means for supporting a thin circuit bearing wafer so that it may be mounted on other equipment without physically attaching the wafer directly to the equipment.

A further object of the present invention is to provide a carrier means for a circuit bearing wafer which facilitates "gang" mounting of such wafers in back to back relationship.

Further objects and advantages of the invention will become apparent as the following description proceeds and the features of novelty which characterize the invention will be pointed out with particularity in the claims annexed to and forming a part of this specification.

DESCRIPTION OF THE PREFERRED EMBODIMENTS

Figure 4:
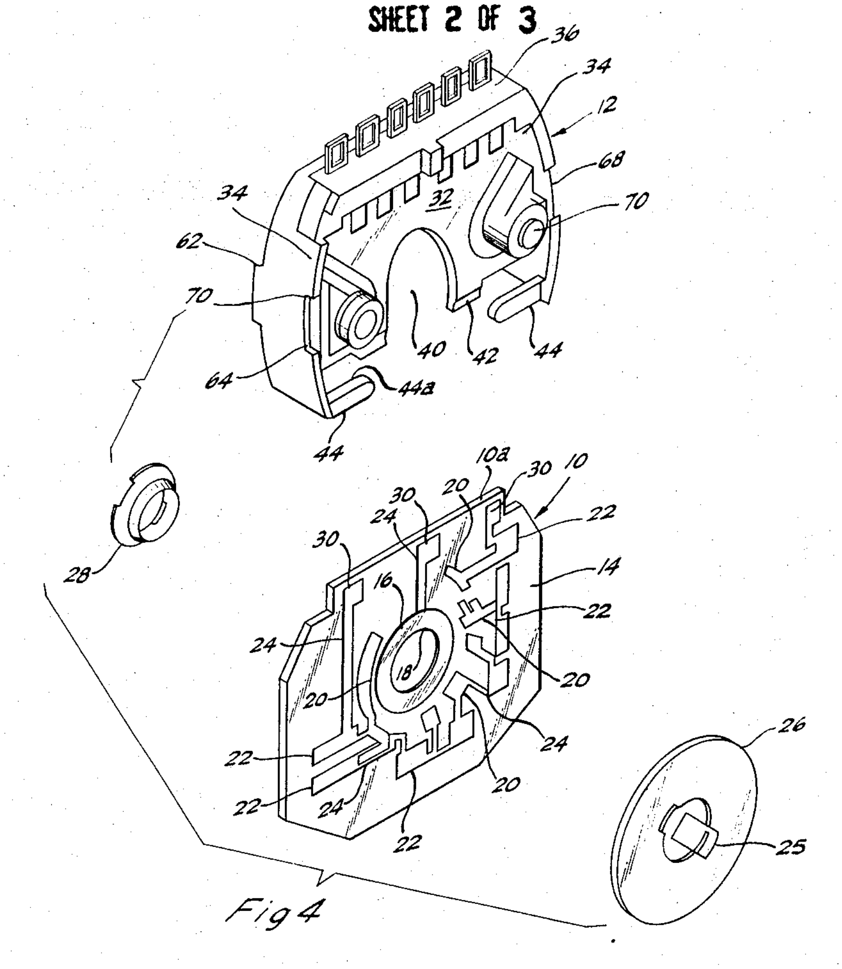
FIG. 4 is an exploded view of the carrier, a circuit switch module and its rotor contact assembly positioned for insertion into the carrier frame.

Referring now to the drawings, in FIG. 4 there is shown an exploded view of an electrical circuit module or wafer in the form of an electrical switch device or base member 10 and its supporting carrier frame 12. The base member 10 is in the form of a thin wafer and may be formed of a nonconductive material, such as filled nylon or other plastic, or may be formed of a nonconductive high-temperature-resistant material, such as a ceramic material of alumina, steatite, or the like. At least one surface 14 of the base member or wafer is flat and supports an electrically conductive circuit network.

In the illustrated embodiment of FIG. 4, the circuit network includes a plurality of switching components including an electrically conductive slip ring 16 formed in an arcuate path around an aperture 18 formed through the wafer 10. Radially outward from the aperture and outwardly of the slip ring 16 are provided a plurality of contact switch pads 20 which are, in turn, electrically connected by deposited conductors 24 with various points on the electrical circuit network. In this embodiment of the invention the switch pads 20 connect at various points along a plurality of resistor elements 22. Along one edge of the wafer 10 are a plurality of terminal pads 30 which are electrically connected by deposited conductors 24 to the slip ring 16 and various points in the electrical circuit network. These pads 30 are spaced along at least one edge of the wafer 10 and provide a means for making electrical connection to a source of power and to other components as will be hereinafter explained.

The electrical circuit network may include other electrical components, which may be either deposited on the surface of the wafer 10 or otherwise mechanically attached thereto. These components may include capacitors, inductors or semiconductor elements required for various types of electrical circuit functions. One particular type of resistance material and conductive material which readily lends itself for deposition on a ceramic substrate for such a circuit network is a cermet material of the type described in U.S. Pat. No. 2,950,995 Place et al. entitled "Electrical Resistance Element" and U.S. Pat. No. 2,950,996 Place et al. entitled "Electrical Resistance Material and Method of Making Same," which patents are assigned to Beckman Instruments, Inc., the assignee of the present application. After the cermet resistance materials are deposited on the surface of the wafer, they may be tailored in order to alter or achieve the desired resistance value or capacitance values required for the electrical circuit network.

A rotor member 26 and locking ring 28 are shown in FIG. 4 in position to be assembled through the aperture 18 for rotation therein. The rotor 26 carries a contact wiper (not shown) which, on rotation of the rotor, engages the slip ring 18 and the respective switch pads 20 thereby successively switching certain resistor elements into and out of the circuit. One example of a rotor of the type shown in FIG. 4 is disclosed in U.S. Pat. No. 3,594,527 issued to Brant et al. entitled "Rotor Assembly for Electrical Switch" issued July 20, 1971, and assigned to Beckman Instruments, Inc., the assignee of the present application. The particular type of rotor contact and the particular type and function of the electrical circuit network on the wafer is not essential to the present invention. The particular circuitry is not intended to be limiting to the invention or the claims attached hereto.

Figure 1:
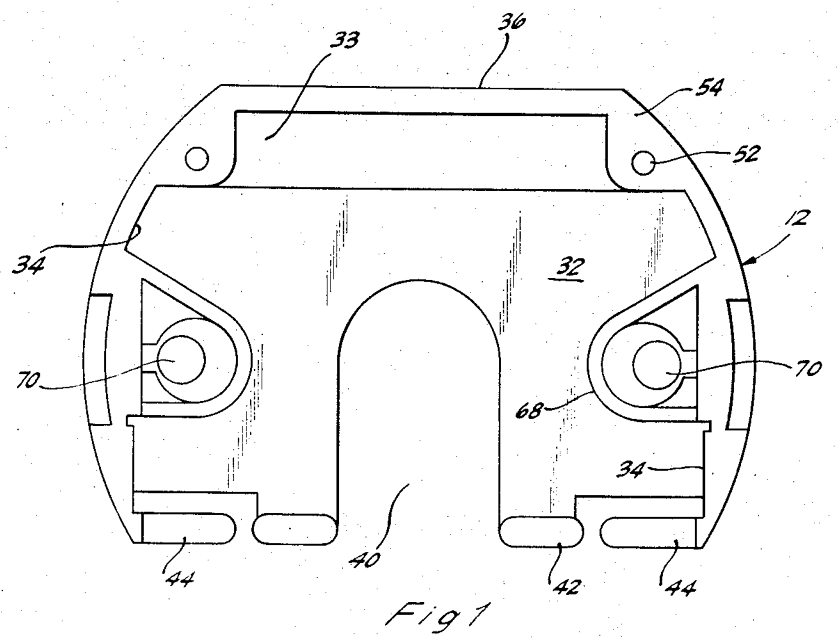
FIG. 1 is a plan view of the support frame without the end wall attached thereto.

As will now be explained, the invention is particularly directed to the carrier member 12 adapted for supporting the wafer 10 and for making contact with the conductive terminal pads 30 on the wafer. As shown in FIG. 1, the carrier member 12 is formed as a supporting frame including a back 32, side walls 34 and an end wall 36 all protruding from the back and encompassing three sides of an interior space 38 (best illustrated in FIG. 3) substantially conforming to the shape of the wafer 10. One side, the downward side shown in FIG. 4, is open so that the wafer 10 can be slid into the space with the wafer generally parallel to the back 32. In this embodiment, the back 32 is provided with an opening 40 designed to accept components protruding from the wafer 10, such as the rotor member when it is positioned on the wafer 10. As may be seen in FIGS. 1 and 4, the opening 40 is sufficiently wide to receive the locking ring 28 of the rotor which protrudes on the opposite side of the wafer, as seen in FIG. 4.

Figure 3:
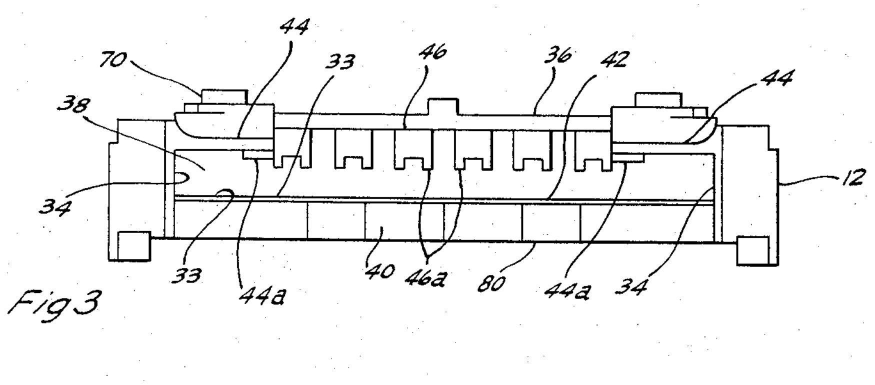
FIG. 3 is an end view illustrating the support frame of FIG. 1 with the terminal assembly positioned thereon.

As will best be seen in FIG. 3, the space 38 defined generally by the side walls 34 and the end wall 36 is adapted to accept the thickness of the wafer 10 when the wafer is inserted through the open side of the frame. The back is provided with slightly upwardly extending knobs 42 which abut against one surface of the wafer 10. Overhanging arms 44, protruding from the end walls 34, are somewhat resilient and are provided with downwardly extending knobs **44*a* which engage the other surface of the wafer, thereby confining the wafer within the space. The distance between the lower surface of knobs 44*a* and the upper surface of knobs 42 is slightly less than the thickness of the wafer 10 so that the thickness of the wafer 10 causes the arms 44 to move slightly away from the back which creates a small force in the arms to retain the wafer 10 between the knobs 44*a* and 42 when fully inserted. While the force is not sufficient to prevent the wafer from being manually inserted through the open end of the frame, the force does securely retain the wafer 10** in place after insertion.

Figure 2:
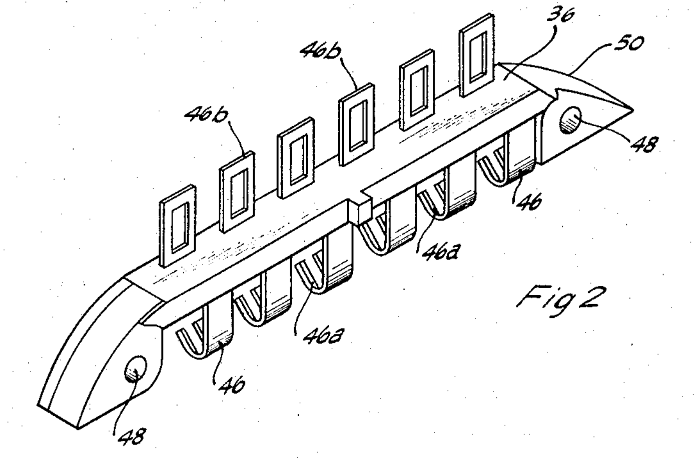
FIG. 2 is a perspective view of the end wall and terminal assembly separated from the support frame.
Figure 6:
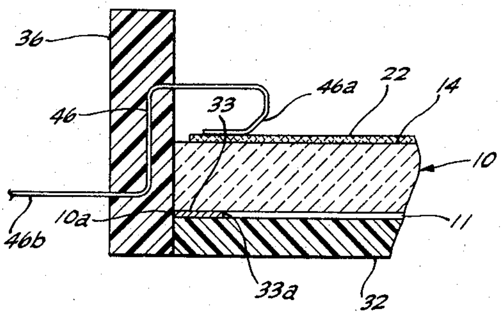
FIG. 6 is a cross-sectional view taken along line 6—6 of FIG. 5 illustrating a terminal of the carrier frame abutting against the surface of the circuit module.

The end wall 36, as best seen in FIG. 2, carries a plurality of terminals 46 which are imbedded in the end wall and protrude on opposite sides thereof. Terminals 46 are preferably formed of an electrically conductive spring material, such as beryllium-copper alloy or the like, and are provided with protruding fingers **46*a* extending toward the back 32 of the frame. A slightly upraised shoulder 33 (see FIGS. 1 and 6) beneath the fingers 46*a* of the terminals forces the wafer 10 toward the terminals as it is inserted into the space encompassed by the carrier frame. Shoulder 33 has a beveled edge 33*a* which guides the forward edge of the wafer 10 and forces it upwardly into contact with the terminals. The upper surface of knobs 42 and the surface of shoulder 33** are the same height above the surface of the back thereby supporting the wafer a short distance above the surface of the back.

On assembly, the wafer 10 is positioned as shown in FIG. 4 with the rotor member attached thereto. The wafer is then inserted beneath the arms 44 and above the knobs 42 and slid into the space bounded by the frame. Side walls 34 act as guides when the wafer is inserted. The wafer is pushed fully into the frame so that the end **10*a* of the wafer abuts against the end wall 36. (See FIG. 6). In this position, the spring terminals 46 and their contact fingers 46*a* are compressed against the surface 14 of the wafer and the terminal pads 30 positioned thereon. In the embodiment shown in FIG. 4, the first spring terminal on the left will contact the first terminal pad 30 formed on the left of the wafer. Another spring terminal will contact the next terminal pad formed on the center of the wafer and the sixth or right-hand terminal will contact the terminal pad 30 formed on the right-hand side of the wafer. The spring pressure of the terminals 46 pinches or exerts a force downwardly against the shoulder 33 extending from the back and thereby provides a frictional force retaining the wafer within the space bounded by the frame. The force of the terminals 46 on the edge 10*a* of the wafer is the primary force holding the wafer in place within the frame. The wafer is physically isolated from all other surfaces excepting knobs 42 and 44*a*** to assure a controlled minimum stress pattern across the wafer both in individual carrier assemblies and when stacked.

As will best be seen in FIGS. 1 and 2, it is preferable to form the end wall 36 which supports the terminals separately from the remaining portions of the carrier frame 12. This permits the use of a low temperature molding plastic for the major portions of the carrier, while using a high-temperature thermosetting plastic, such as diallyl phthalate for the end wall 36. Once cured, the higher temperature diallyl phthalate material will securely retain the terminals 46 and greatly reduces the possibility of the terminals 46 becoming loose when heat is applied to the outwardly extending ends **46*b* when wires are soldered thereto. A higher temperature thermosetting plastic will not soften on the application of heat to the highly heat conductive terminal thereby retaining the terminals solidly in place within the end wall or block 36. When formed in two parts, the carrier frame 12 is best provided with an opening of the shape necessary to receive the end wall and terminal assembly. Holes 48 are formed in the enlarged shoulders 50 of the end wall 36 and these are designed to slip over posts or pins 52 extending from similarly enlarged supporting surfaces 54 formed on the frame. After the end wall 36 is positioned over the posts 52, the outer ends of the posts, which are slightly longer than the thickness of shoulders 50 are ultrasonically staked in place. The heads formed on the posts retain the end wall 36 in position on the frame 12**.

Figures 5, 7, 8:
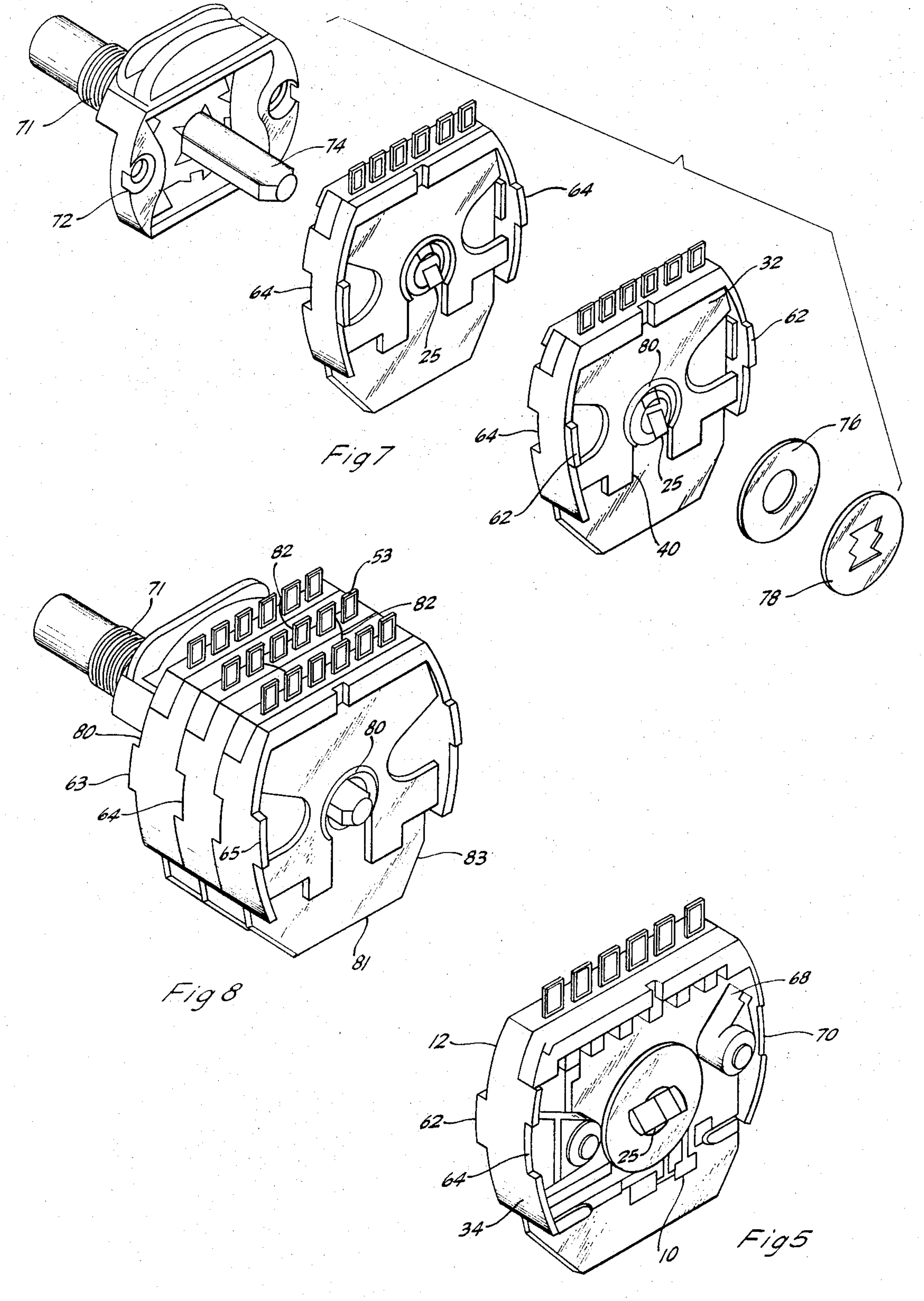
FIG. 5 is a perspective view showing the circuit switch module and carrier frame in assembled position.
FIG. 7 is a perspective exploded view of a pair of switch circuit modules and carriers positioned for assembly with a shaft and detent mechanism.
FIG. 8 is a perspective view of an assembled group of circuit modules in their respective support carriers illustrating a gang-mounted assembly with appropriate interconnection of terminals.

When the wafer is positioned within the carrier frame 12, the assembly appears as shown in FIG. 5. The opening 40 receives the protruding portions of the rotor or any such similar components on the wafer and permits the wafer 10 to be completely inserted into the space formed within the three sides of the frame. Depending on the shape and size of the wafer, the end thereof may extend outwardly from the frame as shown in FIG. 5.

Note that the side walls 34 of the carrier are provided with protruding tabs 62 and slots 64. The purpose of these members is to provide a means for "gang-mounting" or stacking a plurality of carrier members and their wafer or module. The carrier members are arranged in interlocking fashion each with tabs 62 positioned in the slots 64 of the next adjacent carrier member which may or may not be supporting a similar wafer.

The carrier frame is also provided with overhanging arms 68 extending from each side wall 34 (See FIGS. 1 and 4). Arms 68 each carry a knob 70 or protruding circular embossment adapted to fit into a mating opening, such as opening 72 in the detent member 71 shown in FIG. 7. The detent member 71, illustrated in the exploded view of FIG. 7, is a standard type detent provided with mating openings 72 for receiving the knobs 70 of the carrier. The detent includes a shaft 74 which extends through the openings formed in the rotor members 26 carried on the wafers 10 and through the openings 40 formed in the carrier. The shaft engages the rotor 26 and is designed to move the rotor to its various positions in contact with the electrical network on the wafer 10. The interlocking of knobs 70 in the openings 72 of the detent 71 is a standard way of attaching members, such as the carrier frames 10, to such a detent and for preventing the member from rotating when the shaft of the detent member is rotated. As will be seen in FIG. 7, a pair of carrier frames 10 are positioned for assembly over the shaft 74. On assembly, the frames are "ganged" in interlocking fashion with the tabs 62 positioned within the openings 64 similarly as shown in FIG. 8. Once the shaft 74 is positioned through the openings 25 of the rotors the carrier frame and wafers are retained in place axially on the shaft 74 by means of a suitable washer 76 and retaining ring 78. The locking ring shown here is only one type of retaining device.

It is understood that other such devices such as a Truarc locking ring, positioned in a suitable slot in the shaft, could be employed. In order to prevent the retaining ring 78 and washer 76 from binding upon the rotors, an annular ridge 80 (best seen in FIG. 3) is formed on the lower surface of the back 32 of the carrier. Ridge 80 protrudes from the back and spaces the washer 76 from the rotor sleeve 28 positioned within the slot 40 of the carrier frame. FIG. 8 illustrates an assembled switching assembly in which the adjacent carrier frames are stacked or in "ganged" relationship. Conductors 82 are connected to the various terminals and to external circuitry for connecting power and other components to the switching assembly.

The use of the above detent arrangement and shaft locking means facilitates the interchanging of carrier frames or changing to different electrical switch wafers. When a change is desirable it is only necessary to remove the retaining ring, remove the shaft and then slide the wafer from the assembly, replacing it with the new wafer.

Figure 9:
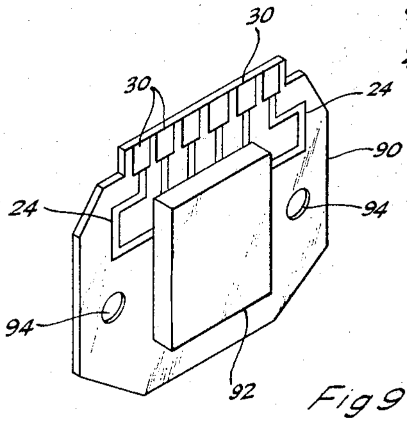
FIG. 9 is a perspective view illustrating another type of circuit module that may be supported in a carrier frame.

It should be understood that the carrier assembly does not necessarily have to be employed with a wafer or module which is a switching device. For example, instead of a wafer having an aperture which supports a rotor member, a wafer, such as wafer 90, shown in FIG. 9, may support an amplifier block 92 which is attached to the surface of the wafer. Electrical connections are made in a well-known manner to the amplifier 92 through conductors 24 deposited on the surface of the wafer. As in the previous example, the conductors 24 connect with appropriate terminal pads 30 on the surface of the wafer adjacent one edge thereof which may be contacted by terminal fingers **46*a* on the carrier frame. The width of the amplifier block 92 should be less than the width between the overhanging arms 44 and/or 68 of the carrier in order to permit the wafer to be inserted into the space provided within the carrier frame. In some instances, it may be desirable to modify the carrier in order to support this type of circuit device. In such an instance, threaded holes are usually provided in the overhanging arms 68 in place of the knobs 70. Mating holes, such as holes 94, are provided through the wafer 90** in order to provide an opening for a post or supporting bolt (not shown) which prevents the wafer from being disengaged from the carrier once inserted therein.

While in accordance with the patent statutes there has been described what is considered to be the preferred embodiments of the invention, it will be obvious to those skilled in the art that various changes and modifications may be made therein without departing from the scope of the invention and it is, therefore, the aim of the appended claims to cover all such changes and modifications as fall within the true spirit and scope of the invention.

What is claimed is:

1. An electrical assembly comprising in combination:

a nonconductive base member in the form of a thin wafer;

an electrical circuit network supported on at least one surface of said wafer including conductive connectors terminating along an edge of said wafer in conductive terminal pads;

a nonconductive frame, said frame having a back with an end wall and sidewalls protruding therefrom, said back, end wall and sidewalls encompassing three sides of an interior space substantially the shape of said thin nonconductive wafer, said frame being open on one end opposite from said end wall, said wafer being positioned in said space with said edge carrying said terminal pads positioned against said end wall of said frame;

at least one electrical terminal supported in said end wall of said frame, said terminal being formed of a spring-like conductive material and having a contact overhanging said back of said frame and spaced therefrom a distance less than the thickness of said wafer and said terminal pads formed thereon, said terminal contact exerting a force against said terminal pad on said wafer thereby making good electrical contact when said wafer is positioned in said space; and resilient nonconductive supporting arms extending from said sidewalls of said frame and spaced a distance from said back less than the thickness of said wafer, said resilient arms exerting a force against the surface of said thin wafer toward the back of said frame thereby retaining said wafer within said space in said frame.

2. The electrical assembly defined in claim 1 in which said wafer is provided with a circular aperture therethrough and said electrical network includes a plurality of switch contact pads disposed on said base in an arcuate array around said aperture, said wafer further including a rotor switching member including conductive contacts adapted to engage said switch pads during rotation of said rotor; and said back of said frame is provided with a slot extending to the open end of said frame into which said rotor contact protrudes when said wafer is positioned in said frame.

3. The electrical assembly defined in claim 1 in which said end wall of said nonconductive frame is a separate part attached to said frame and formed of a heat resistant thermosetting plastic so that heat applied to said terminals during soldering operations does not cause said terminals to loosen within said end wall.

4. The electrical assembly defined in claim 1 in which said carrier frame is provided with protruding tabs extending from the sidewalls and end walls thereof and mating slots formed in the opposite sidewalls and end wall thereby to facilitate a pair of carrier frames to be mounted in interlocking fashion with said tabs of one frame positioned in said slots of the next adjacent carrier frame.

5. An electrical switch assembly comprising:

a nonconductive base member in the form of a thin wafer having an aperture therethrough;

a plurality of switch contact pads disposed on said wafer in an arcuate array around said aperture;

an electrical circuit network supported on said wafer including conductive connectors extending from said switch pads to respective points in said electrical circuit network and having electrical conductors terminating along an edge of said wafer into conductive terminal pads;

a rotor disposed in said aperture through said wafer including a conductive contact adapted to traverse an arcuate path on the surface of said wafer thereby to contact switch pads during rotation of said rotor;

a support carrier and terminal connector for said wafer in the form of a nonconductive frame, said frame having a back with an end wall and sidewalls protruding therefrom, said back, end wall and sidewalls encompassing three sides of an interior space substantially the shape of said thin nonconductive wafer, said frame being open on one end opposite from said end wall whereby said thin wafer may be inserted into said space with said edge carrying said terminal pads positioned against said end wall of said frame;

at least one electrical terminal supported in said end wall of said frame, said terminal being formed of a spring-like conductive material and having a contact overhanging said back of said frame and spaced therefrom a distance less than the thickness of said thin wafer and said terminal pads formed thereon, said terminal contact adapted to exert a force against said terminal pads on said wafer thereby making good electrical contact when said wafer is positioned within said space; and resilient supporting arms extending from said sidewalls of said frame and spaced a distance from said back less than the thickness of said thin wafer, said resilient arms adapted to exert a force against the surface of said wafer toward said back of said frame thereby to retain said wafer within said space in said frame.

6. The electrical switch assembly defined in claim 5 in which there is a slot formed in said back of said frame, said slot opening at said open end of said frame so that said rotor extending from said wafer extends through said slot when said wafer is positioned in said carrier.

7. The electrical switch assembly defined in claim 6 including a shaft means extending through said rotor and said slot in said carrier whereby said rotor and its contact may be rotated to cause said contact to traverse the surface of said wafer.

8. The electrical switch assembly defined in claim 7 in which said shaft means for rotating said rotor includes a detent assembly and said sidewalls of said frame are provided with embossments adapted to mate with similarly formed openings in said detent to facilitate mounting of said carrier frame onto said detent assembly with said shaft means extending through said rotor.

9. The electrical switch assembly defined in claim 5, in which said frame sidewalls and end walls are provided with outwardly extending tabs on one edge thereof, and mating inwardly formed slots on the opposite edge thereof to facilitate mounting a pair of carrier frames in interlocking fashion with said tabs of one frame positioned in said slots of the next adjacent carrier frame.

10. A support carrier and terminal connector for a thin nonconductive wafer having an electrical circuit network deposited upon a surface thereof, including terminal pads positioned along at least one edge thereof comprising;

a nonconductive frame, said frame having a back with an end wall and side walls protruding therefrom, said back, end wall and side walls encompassing three sides of an interior space substantially the shape of said thin nonconductive wafer, said frame being open on one end opposite from said end wall, with said thin wafer removably inserted into said space with said edge carrying the terminal pads positioned against the end wall of said frame;

at least one electrical terminal supported in said end wall of said frame, the terminal being formed of a spring-like conductive material and having a contact overhanging the back of the frame and spaced therefrom a distance less than the thickness of said thin wafer, said terminal contact exerting a force against a corresponding terminal pad on said wafer thereby making good electrical contact when the wafer is positioned in the space; and resilient nonconductive supporting arms extending from the side walls of said frame and spaced a difference from the back less than the thickness of said wafer, said resilient arms exerting a force against the surface of said thin wafer with the wafer in said space to retain the wafer within the frame.

11. The support carrier and terminal connector defined in claim 10 in which said back of said frame is provided with a slot extending from said open end of said frame so that means extending from said nonconductive wafer may extend therein when said wafer is positioned in said frame.

12. The support carrier and terminal connector defined in claim 10 in which said end wall containing said terminals is a separate part attached to said frame and formed of a heat-resistant thermo-setting plastic material so that heat applied to said terminals during soldering operations does not cause said terminals to loosen within said end wall.

* * * * *